United States Patent
Afzali-Ardakani et al.

(10) Patent No.: US 9,041,079 B1
(45) Date of Patent: May 26, 2015

(54) OPTICAL LATCH AND SYNAPTIC SWITCH

(71) Applicant: International Business Machines Corporation, Armonk, NY (US)

(72) Inventors: Ali Afzali-Ardakani, Ossining, NY (US); Tze-Chiang Chen, Yorktown Heights, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/312,467

(22) Filed: Jun. 23, 2014

(51) Int. Cl.
| | |
|---|---|
| *G11C 13/04* | (2006.01) |
| *H01L 29/78* | (2006.01) |
| *H01L 51/44* | (2006.01) |
| *H01L 51/42* | (2006.01) |
| *H01L 29/06* | (2006.01) |
| *H01L 29/16* | (2006.01) |
| *H01L 51/00* | (2006.01) |

(52) U.S. Cl.
CPC ............ *G11C 13/047* (2013.01); *H01L 51/428* (2013.01); *H01L 51/448* (2013.01); *H01L 29/0649* (2013.01); *H01L 29/78* (2013.01); *H01L 29/16* (2013.01); *H01L 51/0071* (2013.01)

(58) Field of Classification Search
CPC .. G11C 13/047; H01L 29/78; H01L 51/0071; H01L 51/428; H01L 51/448
USPC .......................................................... 257/290
See application file for complete search history.

(56) References Cited

U.S. PATENT DOCUMENTS

| | | | |
|---|---|---|---|
| 3,701,117 | A | 10/1972 | Fuller |
| 3,733,197 | A | 5/1973 | Schiele |
| 5,253,198 | A | 10/1993 | Birge et al. |
| 5,268,862 | A | 12/1993 | Rentzepis |
| 5,608,666 | A | 3/1997 | Inushima et al. |
| 6,437,398 | B2 | 8/2002 | Widdershoven |
| 7,345,902 | B2 | 3/2008 | Kulasekeram et al. |
| 7,964,333 | B1 | 6/2011 | Belfield |
| 8,432,718 | B2 | 4/2013 | Saito |
| 2003/0099910 | A1 | 5/2003 | Kim et al. |
| 2003/0174560 | A1 | 9/2003 | Dahmen et al. |
| 2003/0230629 | A1* | 12/2003 | Bourianoff et al. ........... 235/454 |

\* cited by examiner

*Primary Examiner* — Daniel Shook
(74) *Attorney, Agent, or Firm* — Keivan Razavi; Louis Percello

(57) ABSTRACT

An optoelectronic device may include an insulating substrate, a semiconductor channel region located on the insulating substrate, and a source region and a drain region in contact with the semiconductor channel region. A photoswitchable material may be located on the semiconductor channel region between the source region and the drain region, such that the photoswitchable material includes a first structural state based on being exposed to a first optical wavelength, and includes a second structural state based on being exposed to a second optical wavelength. The first structural state causes a first electrical current to flow between the source region and the drain region, while the second structural state causes a second electrical current to flow between the source region and the drain region.

20 Claims, 9 Drawing Sheets

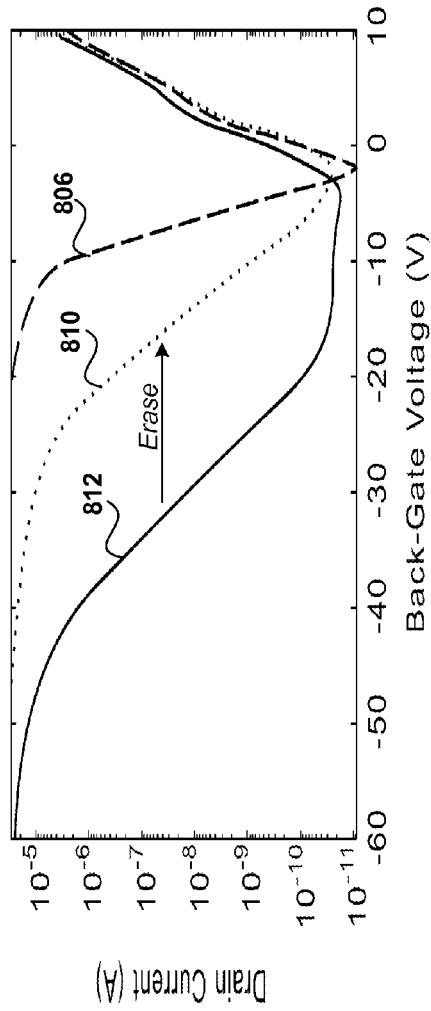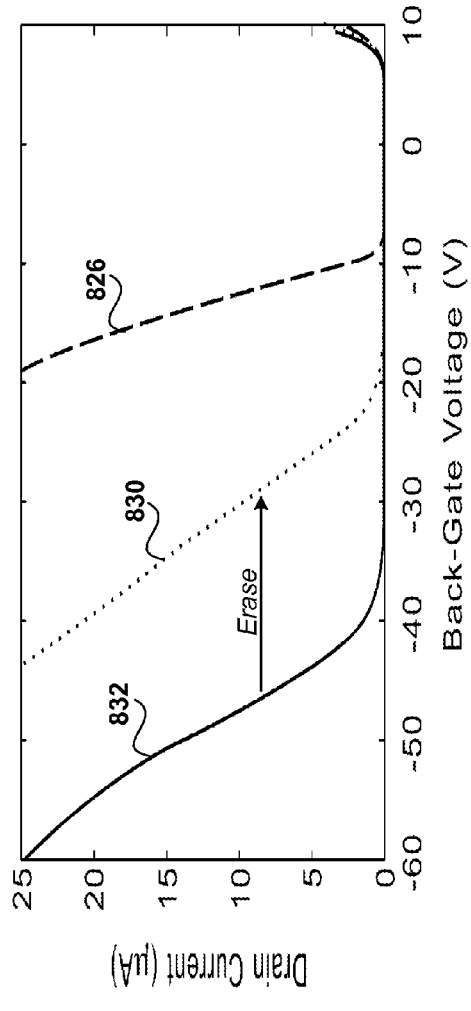
FIG. 8A
FIG. 8B

US 9,041,079 B1

OPTICAL LATCH AND SYNAPTIC SWITCH

BACKGROUND

The present invention generally relates to semiconductor devices, and more particularly, to semiconductor devices utilizing photo-switchable materials.

Optical switches and/or optical memory elements may be incorporated within circuits that include, for example, either optical interconnects or fully optical systems. One example is an optical latch, which may be implemented as a combination of a memory and a switch. According to another example, a synaptic memory element can be programmed using optical signals for neuromorphic computing applications. Neuromorphic computing is based on the operation of synapse structures in biological nervous systems. For example, a biological synapse's resistance may increase or decrease based on pre-synaptic and post-synaptic signals that are delivered by firing neurons. Depending on the order in which the pre-synaptic and post-synaptic signals are received, the synapse may exhibit different transmission states (i.e., passing or inhibiting signals through the synapse).

SUMMARY

According to at least one embodiment, an optoelectronic device may include a photo-switchable material in contact with one or more semiconductor channels (e.g., 3D-Fin or planar), whereby the device may be utilized as, for example, a binary memory element (optical latch) or a multi-state memory element (optical synapse) by facilitating an optically controlled current flow in the channel based on, among other things, the structural state of the photo-switchable material.

According to at least one other embodiment, an optoelectronic device may include an insulating substrate, a semiconductor channel region located on the insulating substrate, and a source region and a drain region in contact with the semiconductor channel region. A photoswitchable material may be located on the semiconductor channel region between the source region and the drain region, such that the photoswitchable material includes a first structural state based on being exposed to a first optical wavelength, and includes a second structural state based on being exposed to a second optical wavelength. The first structural state causes a first electrical current to flow between the source region and the drain region, while the second structural state causes a second electrical current to flow between the source region and the drain region.

According to at least one other embodiment, a method of generating a synaptic switch may include forming a semiconductor channel region above an insulating layer, and forming a photoswitchable material on the semiconductor channel region, whereby the photoswitchable material switches towards a first structural state based on being exposed to a first optical wavelength, and switches towards a second structural state based on being exposed to a second optical wavelength. The photoswitchable material is exposed with a first optical signal that includes a first optical pulse having the first optical wavelength followed by a second optical pulse having the second optical wavelength. The photoswitchable material is also exposed with a second optical signal that includes a third optical pulse having the second optical wavelength followed by a fourth optical pulse having the first optical wavelength. The photoswitchable material switches in-between the first structural state and the second structural state based on a timing order between the first and the second optical signal.

According to at least one other embodiment, a method of forming an optoelectronic device may include providing an insulating substrate; forming a semiconductor layer above the insulating substrate, whereby the semiconductor layer creates a semiconductor channel region having a thickness; and forming a source region and a drain region in contact with the semiconductor channel region. A photoswitchable material is formed on the semiconductor channel region between the source region and the drain region, such that the photoswitchable material switches to a first structural state based on being exposed to a first optical wavelength, and switches to a second structural state based on being exposed to a second optical wavelength. The first structural state generates a first depletion region within the semiconductor channel region, while the second structural state generates a second depletion region within the semiconductor channel region.

BRIEF DESCRIPTION OF THE SEVERAL VIEWS OF THE DRAWINGS

FIGS. 8A and 8B illustrate additional graphs representing the operating principle (Read/Write/Erase) of the optoelectronic device of FIG. 6 according to an embodiment;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

The following described and illustrated exemplary structures and methods include, among other things, optoelectronic devices capable of being utilized within various memory applications.

Figure 1:
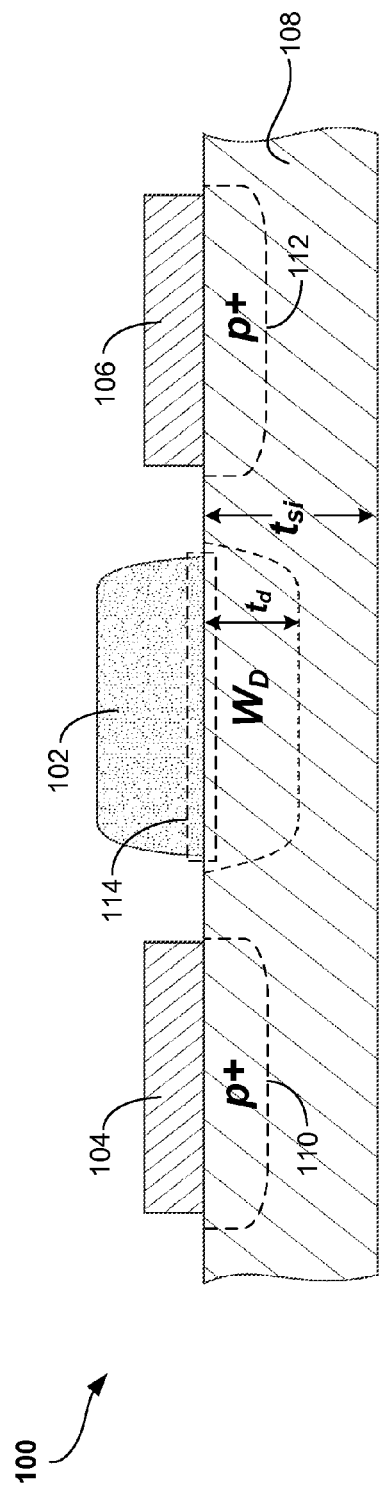
FIG. 1 illustrates a cross-sectional view of an optoelectronic device according to one embodiment.

Referring to FIG. 1, an optoelectronic device 100 according to one embodiment is depicted. The optoelectronic device 100 may include a photoswitchable material 102, electrical contact 104, electrical contact 106, a semiconductor channel region 108, a source region 110, and a drain region 112. In the illustrated exemplary embodiment, the source region 110 and the drain region 112 are formed within the semiconductor channel region 108. In alternative structures, the source region 110 and the drain region 112 may be formed on the surface (not shown) of the semiconductor channel region 108. The photoswitchable material 102 is located on the semiconductor channel region 108 between the source region 110 and the drain region 112. Electrical contact 104 is coupled to source region 110, while electrical contact 106 is coupled to drain region 112.

The photoswitchable material 102 may include a first structural state based on being exposed to a first optical wavelength. Alternatively, photoswitchable material 102 may include a second structural state based on being exposed to a second optical wavelength. For example, referring to FIG. 2, a 1',3'-Dihydro-8-methoxy-1',3',3'-trimethyl-6-nitrospiro [2H-1-benzopyran-2,2'-(2H)-indole] molecule 200 may be used to form photoswitchable material 102 (FIG. 1). When the 1',3'-Dihydro-8-methoxy-1',3',3'-trimethyl-6-nitrospiro [2H-1-benzopyran-2,2'-(2H)-indole] molecule 200 is in a first structural state 202, exposure to an ultraviolet (UV) wavelength 204 causes the 1',3'-Dihydro-8-methoxy-1',3',3'-trimethyl-6-nitrospiro [2H-1-benzopyran-2,2'-(2H)-indole] molecule 200 to switch to a second structural state 206. Moreover, when the 1',3'-Dihydro-8-methoxy-1',3',3'-trimethyl-6-nitrospiro [2H-1-benzopyran-2,2'-(2H)-indole] molecule 200 is in the second structural state 206, exposure to an infrared (IR) to visible wavelength range 208 causes the 1',3'-Dihydro-8-methoxy-1',3',3'-trimethyl-6-nitrospiro [2H-1-benzopyran-2,2'-(2H)-indole] molecule 200 to switch back to the first structural state 202. Once in one structural state, the 1',3'-Dihydro-8-methoxy-1',3',3'-trimethyl-6-nitrospiro [2H-1-benzopyran-2,2'-(2H)-indole] molecule 200 remains in that state until exposure to a particular wavelength causes a molecular change. The 1',3'-Dihydro-8-methoxy-1',3',3'-trimethyl-6-nitrospiro [2H-1-benzopyran-2,2'-(2H)-indole] molecule 200 may be thermally evaporated on the semiconductor channel region 108 (FIG. 1) at room temperature.

Referring back to FIG. 1, the semiconductor channel region 108 may include a silicon substrate having a thickness $t_{si}$ in the range of about 5-500 nm The semiconductor channel region 108 may, for example, be formed from silicon and doped with acceptors (e.g., Boron) to a doping concentration in the range of about $5 \times 10^{14}$ cm$^{-3}$ to $5 \times 10^{18}$ cm$^{-3}$. The source region 110 and the drain region 112 may be formed by positively doping designated areas of the semiconductor channel region 108 to form the p+ regions in a manner similar to, or identical to that used to form source/drain regions of Field Effect Transistor (i.e., p-channel device) structures. For example, P-type acceptors such as Boron (B) may be used to create the p+ regions.

Based on the formation of the photoswitchable material 102 on the semiconductor channel region 108, an interface region 114 is created between the photoswitchable material 102 and the semiconductor channel region 108. A depletion region $W_D$ is created by the formation of this interface region 114 between the photoswitchable material 102 and the semiconductor channel region 108. The thickness $t_d$ of this depletion region $W_D$ varies based on the wavelength and/or intensity of the optical signal that is incident on the photoswitchable material 102. The depletion region $W_D$ may be determined by the following equation:

$$W_D \approx (2 \in_{Si} V_{bi}/qN_A)^{1/2} \qquad \text{Equation (1)}$$

Where $\in_{Si}$ is the permittivity of silicon, $V_{bi}$ is the built-in potential associated with the interface region 114, $N_A$ is the density of acceptors in a silicon semiconductor channel region 108 that is doped to create a P-type silicon channel region 108, and q is the charge of an electron (i.e., $1.6 \times 10^{-19}$ C).

In an alternative embodiment, the semiconductor channel region 108 may, for example, be formed from silicon and doped with donors (e.g., Phosphorous) to a doping concentration in the range of about $5 \times 10^{14}$ cm$^{-3}$ to $5 \times 10^{18}$ cm$^3$. The source region 110 and the drain region 112 may be formed by negatively doping the semiconductor channel region 108 to form the n+ regions in a manner similar to, or identical to that used to form source/drain regions of Field Effect Transistor (i.e., n-channel device) structures. For example, N-type donors such as phosphorous (P) may be used to create the n+ regions. The depletion region $W_D$ may now be determined by the following equation:

$$W_D \approx (2 \in_{Si} V_{bi}/qN_D)^{1/2} \qquad \text{Equation (2)}$$

Where $\in_{Si}$ is the permittivity of silicon, $V_{bi}$ is the built-in potential associated with the interface region 114, $N_D$ is the density of donors in a silicon semiconductor channel region 108 that is doped to create an N-type silicon channel region 108, and q is the charge of an electron (i.e., $1.6 \times 10^{-19}$ C).

Figure 2:
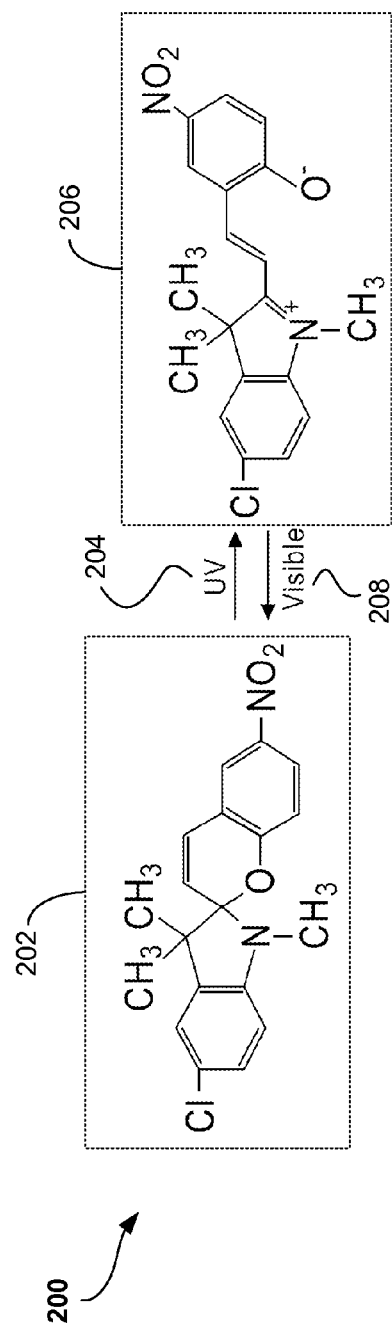
FIG. 2 illustrates molecular diagrams for an exemplary photoswitchable material according to one embodiment.

In operation, the optoelectronic device 100 may operate as an optical latch or binary memory element. For example, a positive voltage may be applied to electrical contact 104, while electrical contact 106 may be grounded. The photoswitchable material 102 may be in the first structural state based on being exposed to the first optical wavelength. For example, the 1',3'-Dihydro-8-methoxy-1',3',3'-trimethyl-6-nitrospiro [2H-1-benzopyran-2,2'-(2H)-indole] molecule 200 (FIG. 2) forming photoswitchable material 102 may be in a first structural state 202 (FIG. 2) based on being exposed to a visible (e.g., red) wavelength 208 (FIG. 2). In the first structural state 202 (FIG. 2), the built-in potential $V_{bi}$ may cause the thickness $t_d$ of the depletion region $W_D$ to increase to approximately the same thickness $t_{si}$ as the semiconductor channel region 108. The depletion region $W_D$ may therefore impede the formation of an electrically conductive channel between the source region 110 held at the positive voltage and the grounded drain region 112. In one implementation, the impeded current flow (i.e., negligent current) may be interpreted as a 'binary 0'.

Alternatively, the photoswitchable material 102 may be in the second structural state based on being exposed to the second optical wavelength. For example, the 1',3'-Dihydro-8-methoxy-1',3',3'-trimethyl-6-nitrospiro [2H-1-benzopyran-2,2'-(2H)-indole] molecule 200 (FIG. 2) forming photoswitchable material 102 may be in a second structural state 206 (FIG. 2) based on being exposed to an ultraviolet (UV) wavelength 204 (FIG. 2). In the second structural state 202 (FIG. 2), the built-in potential $V_{bi}$ may cause the thickness $t_d$ of the depletion region $W_D$ to reduce to the extent that an electrically conductive channel is formed between the source region 110 held at the positive voltage and the grounded drain region 112. In one implementation, the positive current flow may be indicative of a stored 'binary 1'.

Figure 3:
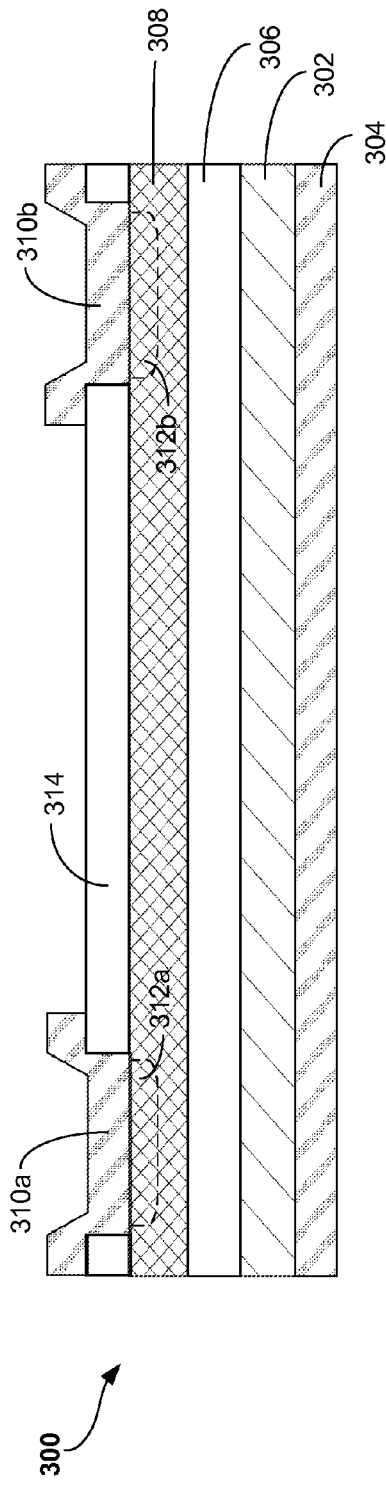
FIG. 3 illustrates an exemplary transistor structure that may be used in the formation of an optoelectronic device, according to one embodiment.

Referring to FIG. 3, an exemplary transistor structure 300 used in the formation of an optoelectronic device such as optoelectronic device 100 (FIG. 1) or 600 (FIG. 6) is depicted. The transistor structure 300 may include a handle substrate layer 302, a metal back gate 304 formed on the underside of the handle substrate layer 302, a buried oxide (BOX) insulating layer 306 formed directly on the handle substrate layer 302, a p-type semiconductor channel region 308 formed directly on the BOX 306, a first metal contact 310a for electrically coupling to (i.e., biasing) a source region 312a within the p-type semiconductor channel region 308, a second metal contact 310b for electrically coupling to (i.e., biasing) a drain region 312b within the p-type semiconductor channel region 308, and an oxide layer 314 formed directly over the p-type semiconductor channel region 308 and between the metal contacts 310a, 310b. The p-type semiconductor channel region 308 may include a acceptor concentration ($N_A$) of $5\times10^{17}$ cm$^{-3}$ and a thickness of, for example, 32 nanometers (nm). The BOX may include a thickness of about 140 nm. Also, an oxide layer 314 may be formed over the p-type semiconductor channel region 308.

Figure 4:
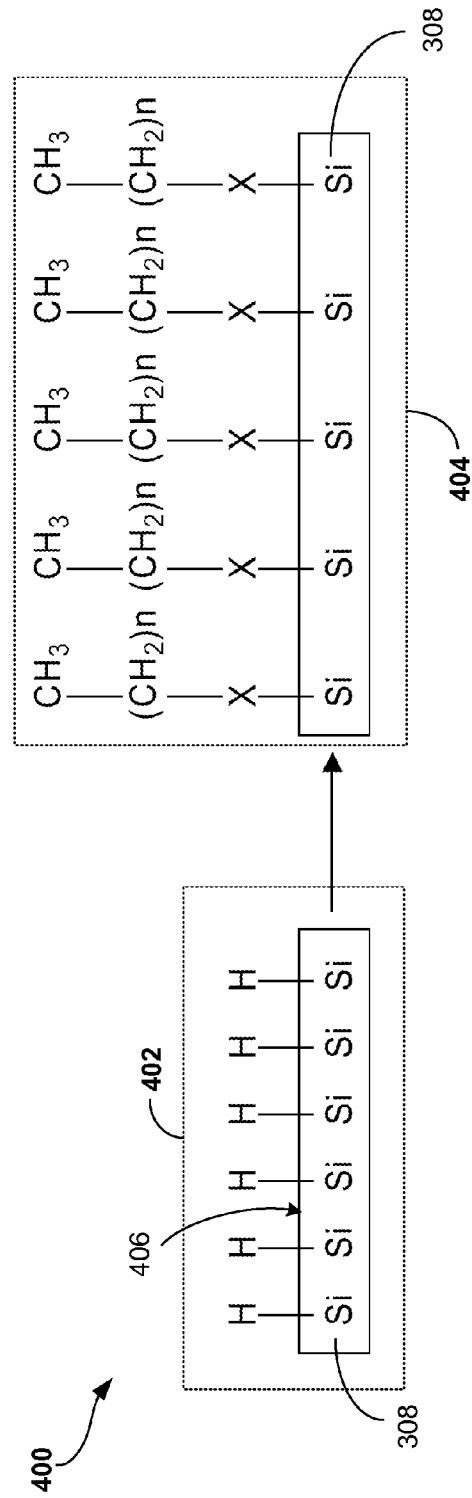
FIG. 4 illustrates the process of forming a passivation layer on the exemplary transistor structure of FIG. 3, according to one embodiment.

Referring to FIG. 4, a process 400 of forming a passivation layer on the exemplary transistor structure of FIG. 3, according to one embodiment is depicted. Process 400 is described with the aid of the embodiment of FIG. 3. At process 402, the top oxide 314 (FIG. 3) formed directly over the p-type semiconductor channel region 308 (FIG. 3) is removed using a Hydrofluoric Acid (HF) etch. As depicted at 402, following the HF etch, the surface bonds of the silicon within the semiconductor channel region 308 are terminated with Hydrogen (H), thus mitigating the occurrence of dangling bonds. At 404, an organic passivation mono-layer may be formed by self-assembly from a $CH_3(CH_2)_{10}CH_2OH$ (1-dodecanol) reagent grown over the H-terminated surface 406 of the semiconductor channel region 308 created during process 402. A photoswitchable structure or molecule may subsequently be evaporated on the top surface of the grown organic passivation mono-layer. An example of the above-described passivation layer is depicted and described in relation to an exemplary optoelectronic device illustrated in FIG. 6.

Figure 5:
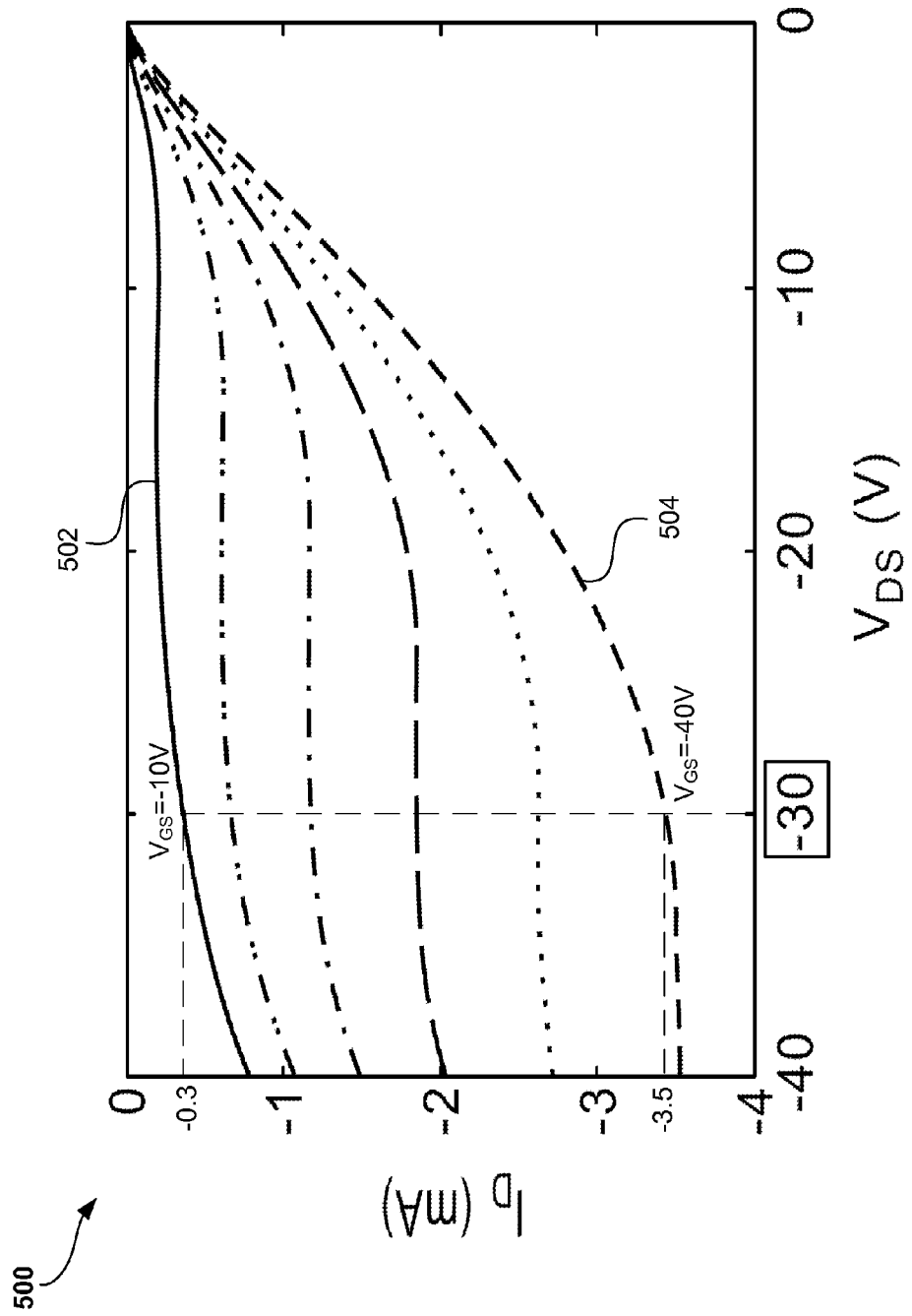
FIG. 5 illustrates characteristic curves for the exemplary transistor structure of FIG. 3, according to one embodiment.

Referring to FIG. 5, characteristic curves 500 for the exemplary transistor structure 300 (FIG. 3) used in the formation of an optoelectronic device such as optoelectronic device 100 (FIG. 1) or 600 (FIG. 6) is depicted. Prior to forming the organic passivation mono-layer depicted and illustrated in relation to FIG. 4, the functional integrity of the exemplary transistor structure 300 (FIG. 3) is evaluated. The depicted characteristic curves 500 provide an indication that transistor structure 300 (FIG. 3) is operating correctly. The curves 500 provide a measure of transistor channel current flow ($I_D$) against drain-source voltage ($V_{DS}$) for different gate-source voltages ($V_{GS}$). For example, curve 502 corresponds to a gate-source voltage ($V_{GS}$) of $-10V$, while curve 504 corresponds to a gate-source voltage ($V_{GS}$) of $-40V$. Thus, based on a drain-source voltage ($V_{DS}$) of $-30V$, the channel current flow ($I_D$) at a gate-source voltage ($V_{GS}$) of $-40V$ is about $-3.5$ mA, while for the same drain-source voltage ($V_{DS}$) of $-30V$, the channel current flow ($I_D$) at a gate-source voltage ($V_{GS}$) of $-10V$ is reduced to about $-0.3$ mA. Accordingly, the transistor characteristic curves 500 show an expected swing in current based on gate-source voltage ($V_{GS}$).

Figure 6:
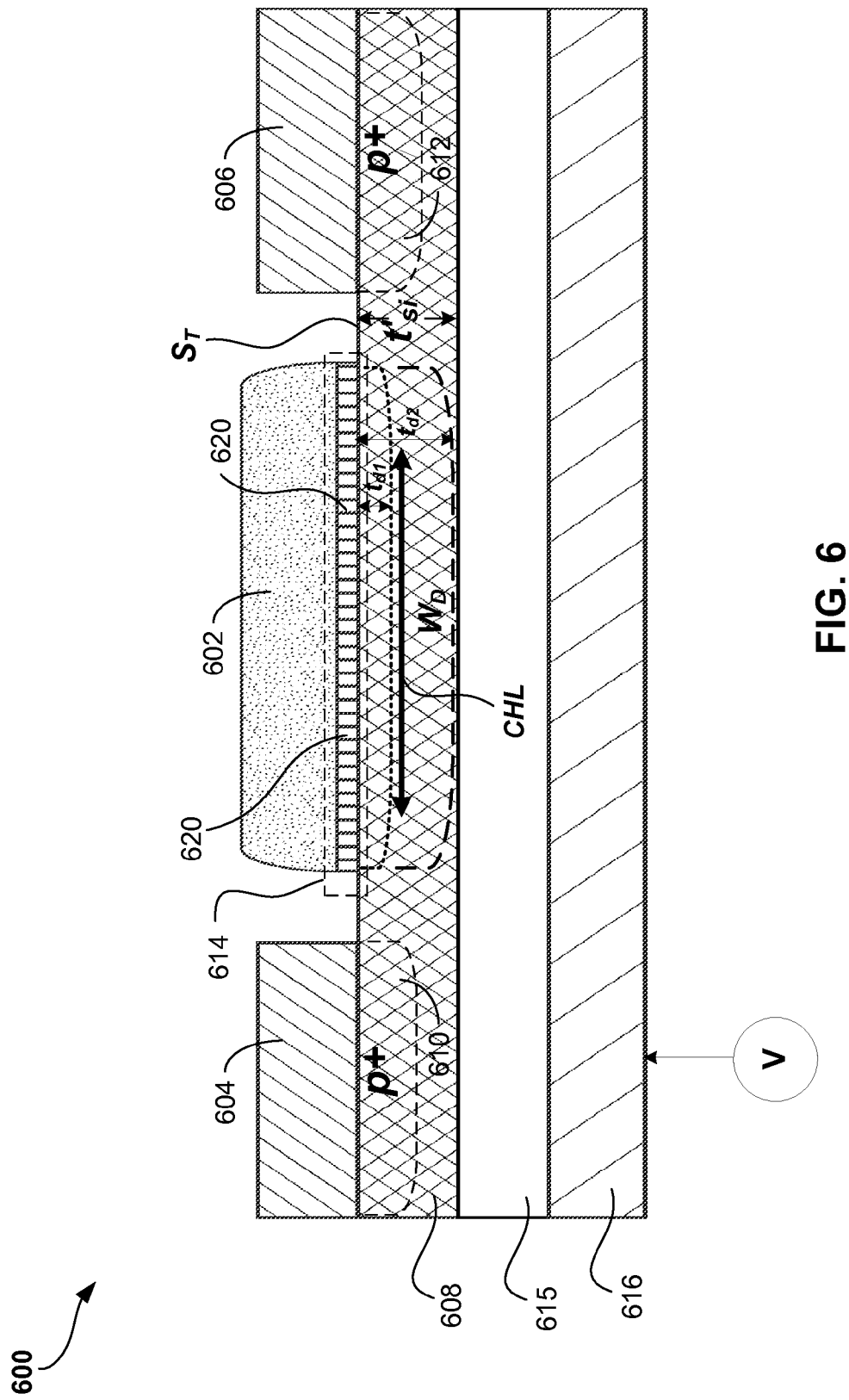
FIG. 6 illustrates a cross-sectional view of an optoelectronic device having the passivation layer of FIG. 4 and a similar structure to that of FIG. 3, according to another embodiment.

Referring to FIG. 6, an optoelectronic device 600 according to one embodiment is depicted. The optoelectronic device 600 may include a photoswitchable material 602, electrical contact 604, electrical contact 606, a semiconductor channel region 608, a source region 610, a drain region 612, an insulating substrate such as a buried oxide layer (BOX) 615, a metal back-gate structure 616, and a passivation layer 620.

As depicted, the metal back-gate structure 616 is formed on the underside of the BOX layer 615 (i.e., insulating substrate), while the semiconductor channel region 608 is formed on the top surface of the BOX layer 615. The source region 610 and the drain region 612 are in contact with the semiconductor channel region 608. In particular, the source region 610 and the drain region 612 may be formed within the semiconductor channel region 608. In alternative structures (e.g., 3D structures), the source region 610 and the drain region 612 may be formed on the surface (not shown) of the semiconductor channel region 608. The passivation layer 620 is located on the surface $S_T$ of the semiconductor channel region 608 between the source region 610 and the drain region 612. As previously described, the passivation layer 620 may include an organic passivation mono-layer formed from a $CH_3(CH_2)_{10}CH_2OH$ (1-dodecanol) reagent grown over the H-terminated surface $S_T$ of the semiconductor channel region 608.

The photoswitchable material 602 is located over the passivation layer 620 between the source region 610 and the drain region 612. Electrical contact 604 is coupled to source region 610, while electrical contact 606 is coupled to drain region 612. The photoswitchable material 602 may include a first structural state based on being exposed to a first optical wavelength. Alternatively, photoswitchable material 602 may include a second structural state based on being exposed to a second optical wavelength. As previously described in relation to FIG. 2, the photoswitchable material 602 may, for example, include a 1',3'-Dihydro-8-methoxy-1',3',3'-trimethyl-6-nitrospiro [2H-1-benzopyran-2,2'-(2H)-indole] molecule 200 (FIG. 2). When the 1',3'-Dihydro-8-methoxy-1',3', 3'-trimethyl-6-nitrospiro [2H-1-benzopyran-2,2'-(2H)-indole] molecule 200 is in a first structural state 202 (FIG. 2), exposure to an ultraviolet (UV) wavelength 204 (FIG. 2) causes the 1',3'-Dihydro-8-methoxy-1',3',3'-trimethyl-6-nitrospiro [2H-1-benzopyran-2,2'-(2H)-indole] molecule 200 to switch to a second structural state 206 (FIG. 2). Moreover, when the 1',3'-Dihydro-8-methoxy-1',3',3'-trimethyl-6-nitrospiro [2H-1-benzopyran-2,2'-(2H)-indole] molecule 200 is in the second structural state 206, exposure to an infrared (IR) to visible wavelength range 208 (FIG. 2) causes the 1',3'-Dihydro-8-methoxy-1',3',3'-trimethyl-6-nitrospiro [2H-1-benzopyran-2,2'-(2H)-indole] molecule 200 to switch back to the first structural state 202. Once in one structural state, the 1',3'-Dihydro-8-methoxy-1',3',3'-trimethyl-6-nitrospiro [2H-1-benzopyran-2,2'-(2H)-indole] molecule 200 remains in that state until exposure to a particular wavelength causes a molecular change. The 1',3'-Dihydro-8-methoxy-1',3',3'-trimethyl-6-nitrospiro [2H-1-benzopyran-2,2'-(2H)-indole] molecule 200 may be thermally evaporated on the passivation layer 620 at room temperature.

The semiconductor channel region 608 may include a silicon substrate having a thickness $t'_{si}$ in the range of about 5-500 nm The semiconductor channel region 608 may, for example, be formed from silicon and doped with acceptors (e.g., Boron) to a doping concentration in the range of about $5\times10^{14}$ cm$^{-3}$ to $5\times10^{18}$ cm$^{-3}$. The source region 610 and the drain region 612 may be formed by positively doping (i.e., by ion implantation) designated areas of the semiconductor channel region 608 to form the p+ regions in a manner similar to, or identical to that used to form source/drain regions of Field Effect Transistor (i.e., p-channel device) structures. For example, P-type acceptors such as Boron (B) may be used to create the p+ regions.

Based on the formation of the photoswitchable material 602 on the passivation layer 620, an interface region 614 is created between the photoswitchable material 602 and the semiconductor channel region 608. Within interface region 614, the passivation layer 620 acts as an intermediary layer between the photoswitchable material 602 and the semiconductor channel region 608. By using the passivation layer 620 as an intermediary layer (e.g., organic passivation mono-layer) between the photoswitchable material 602 and the semiconductor channel region 608, Fermi level pinning may be avoided. Typically, Fermi level pining may occur as a result of the direct contact between the photoswitchable material 602 and the semiconductor channel region 608. The passivation layer 620 thus mitigates the occurrence of the Fermi level pinning phenomenon, which allows energy level band bending between the photoswitchable material 602 and the semiconductor channel region 608. Band bending in turn allows for variations in depletion layer $W_D$ thickness as a function of changes to the structural state of the photoswitchable material 602 in response to different incident optical wavelengths. Consequently, current flow in the semiconductor channel region 608 may increase or decrease as a function of the depletion layer $W_D$ thickness.

As depicted, the depletion region $W_D$ is created by the formation of interface region 614. The thickness of this depletion region $W_D$ varies based on the wavelength and/or intensity of the optical signal that is incident on the photoswitchable material 602. The depletion region $W_D$ may be determined by Equation (1), as indicated above, where $\in_{Si}$ is the permittivity of silicon, $V_{bi}$ is the built-in potential associated with the interface region 614, $N_A$ is the density of acceptors (e.g., Boron) in a silicon semiconductor channel region 608 that is doped to create a P-type silicon channel region 608, and q is the charge of an electron (i.e., $1.6 \times 10^{-19}$ C).

In an alternative embodiment, the semiconductor channel region 608 may, for example, be formed from silicon and doped with donors (e.g., Phosphorous) to a doping concentration in the range of about $5 \times 10^{14}$ cm$^{-3}$ to $5 \times 10^{18}$ cm$^3$. The source region 610 and the drain region 612 may be formed by negatively doping designated areas of the semiconductor channel region 608 to form the n+ regions in a manner similar to, or identical to that used to form source/drain regions of Field Effect Transistor (i.e., n-channel device) structures. For example, N-type donors such as phosphorous (P) may be used to create the n+ regions. The depletion region $W_D$ may now be determined by Equation (2), as indicated above, where $\in_{Si}$ is the relative permittivity of silicon, $V_{bi}$ is the built-in potential associated with the interface region 614, $N_D$ is the density of donors in a silicon semiconductor channel region 608 that is doped to create an N-type silicon channel region 608, and q is the charge of an electron (i.e., $1.6 \times 10^{-19}$ C).

In operation, optoelectronic device 600 may, for example, operate as an optical latch or binary memory element. In such an exemplary application, a positive voltage may be applied to electrical contact 604, while electrical contact 606 may be grounded. The photoswitchable material 602 may be in the second structural state based on being exposed to the second optical wavelength. For example, the 1',3'-Dihydro-8-methoxy-1',3',3'-trimethyl-6-nitrospiro [2H-1-benzopyran-2,2'-(2H)-indole] molecule 200 (FIG. 2) forming photoswitchable material 602 may be in a second structural state 206 (FIG. 2) based on being exposed to a UV wavelength 204 (FIG. 2).

In the second structural state 206 (FIG. 2), the built-in potential $V_{bi}$ may cause the thickness of the depletion region $W_D$ to increase to $t_{d2}$. In some embodiments, the thickness $t'_{si}$ of the semiconductor channel region 608 is selected such that the depletion region $W_D$ increases to a thickness $t_{d2}$ that is approximately the same thickness $t'_{si}$ as the semiconductor channel region 608. However, in other embodiments, the thickness $t'_{si}$ of the semiconductor channel region 608 may be such that the depletion region $W_D$ increases to a thickness that is less than the thickness $t'_{si}$ of the semiconductor channel region 608. In such an embodiment, a biasing voltage (V) may therefore be applied to the metal back-gate structure 616 in order to subsequently cause the depletion region $W_D$ to further increase to a thickness $t_{d2}$ that is substantially the same as the thickness $t'_{si}$ of the semiconductor channel region 608, as depicted. The increased depletion region $W_D$ to thickness $t_{d2}$ may therefore impede the formation of an electrically conductive channel between the source region 610 and the drain region 612. The metal back-gate structure 616 therefore controls the current flow between the source region 610 and the drain region 612 based on the application of the biasing voltage (V). The metal back-gate structure 616 may exert some control over the current flow in either or both the first and second structural state 202, 206 (FIG. 2). In one implementation, the impeded current flow (i.e., negligent current) from the increased depletion region $W_D$ may be interpreted as a 'binary 0'.

Alternatively, the photoswitchable material 602 may be in the first structural state 202 (FIG. 2) based on being exposed to the first optical wavelength. For example, the 1',3'-Dihydro-8-methoxy-1',3',3'-trimethyl-6-nitrospiro [2H-1-benzopyran-2,2'-(2H)-indole] molecule 200 (FIG. 2) forming photoswitchable material 602 may be in a first structural state 202 (FIG. 2) based on being exposed to a visible (e.g., red) wavelength 208 (FIG. 2). In the first structural state 202 (FIG. 2), the built-in potential $V_{bi}$ may cause the thickness $t_{d1}$ of the depletion region $W_D$ to reduce to the extent that an electrically conductive channel, as indicated by CHL, is formed between the source region 610 and the drain region 612. In one implementation, the positive current flow induced, in part, by the reduced depletion region $W_D$, may be indicative of a stored 'binary 1'. The metal back-gate structure may be formed from, for example, gold (Au) or chromium (Cr), or any other suitable metallic compound.

Figure 7A:
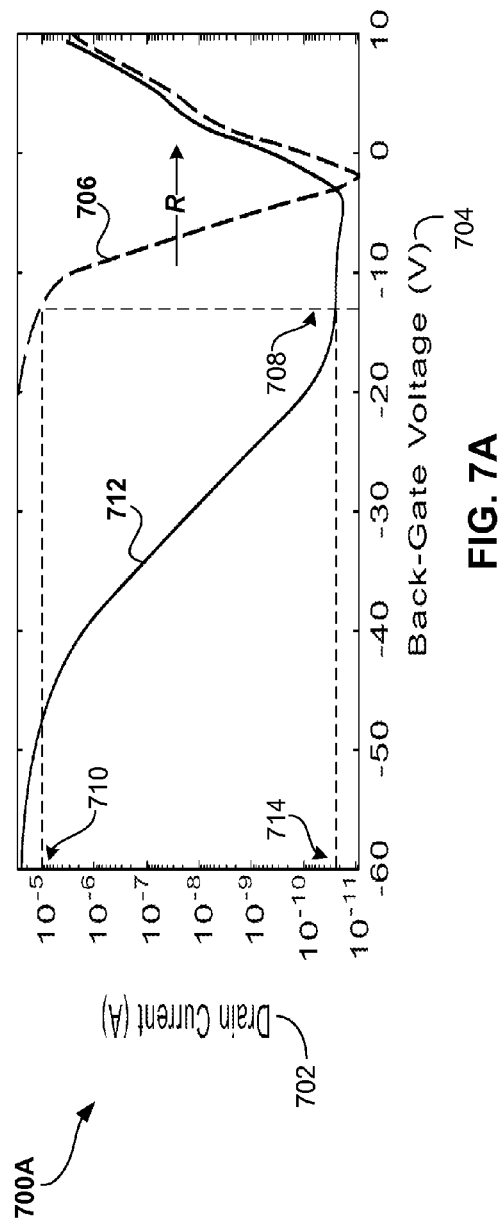
FIGS. 7A and 7B illustrate graphs representing the operating principle (Read/Write) of the optoelectronic device of FIG. 6 according to an embodiment.

Referring to FIG. 7A, a graph 700A representing the operating principle of the optoelectronic device 600 of FIG. 6 is depicted. More particularly, graph 700A depicts the drain/source current 702 as a function of back-gate voltage 704 applied to the back-gate structure 616 (FIG. 6) of the optoelectronic device 600 (FIG. 6). Curve 706 shows the drain/source current 702 as a function of back-gate voltage 704 when the optoelectronic device 600 (FIG. 6) has been exposed to an infrared-visible wavelength. Curve 706 thus corresponds to the optoelectronic device 600 when the photoswitchable material 602 (FIG. 6) is in the first structural state 202 (FIG. 2). For example, for a back gate voltage of about −13V 708 applied to the back-gate structure 616 (FIG. 6), approximately 100 μA 710 of current may flow between the drain/source of the optoelectronic device 600. However, after exposing the optoelectronic device 600 to a UV wavelength incident optical signal, the photoswitchable material 602 changes from the first structural state 202 (FIG. 2) to the second structural state 206 (FIG. 2). The optoelectronic device 600 now follows the operational characteristics exhibited by curve 712. Thus, for the same applied back gate voltage of about −13V 708, the current flow between the drain/source of the optoelectronic device 600 now reduces by a factor of approximately $5 \times 10^6$ to about 20 μA 714.

It may be appreciated that the thickness $t'_{si}$ or the doping concentration of the semiconductor channel region 608 may be designed in a manner, that for no back-gate voltage (i.e., 0V), the semiconductor channel region 608 is not depleted. Thus, curve 706 may typically shift to the right, as indicated by arrow R, such that for no back-gate voltage (i.e., 0V), approximately 100 μA 710 of current may flow between the drain/source of the optoelectronic device 600. Curve 706 may represent a read operation, while curve 712 may represent a write operation.

Figure 7B:
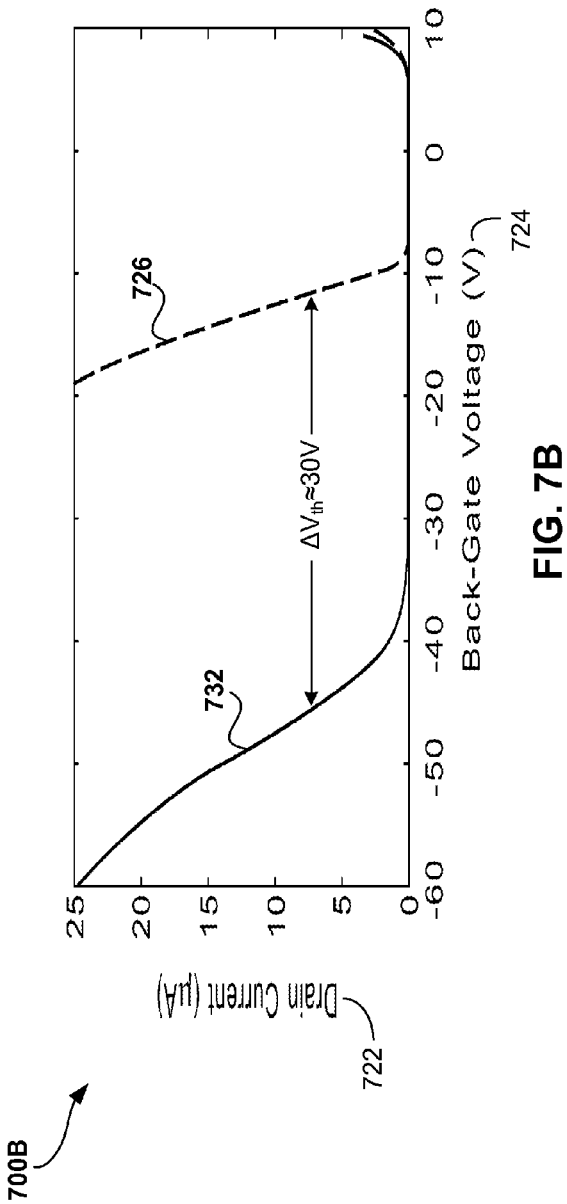

Referring to FIG. 7B, another graph 700B representing the operating principle of the optoelectronic device 600 of FIG. 6 is depicted. More particularly, graph 700B also depicts the drain/source current 722 as a function of back-gate voltage 724 applied to the back-gate structure 616 (FIG. 6) of the optoelectronic device 600 (FIG. 6). Curve 726 shows the drain/source current 722 as a function of back-gate voltage 724 when the optoelectronic device 600 (FIG. 6) has been exposed to an infrared-visible wavelength. Curve 726 thus corresponds to the optoelectronic device 600 when the photoswitchable material 602 is in the first structural state 202 (FIG. 2). However, after exposing the optoelectronic device 600 to a UV wavelength incident optical signal, the photoswitchable material 602 changes from the first structural state 202 (FIG. 2) to the second structural state 206 (FIG. 2). The optoelectronic device 600 now follows the operational characteristics exhibited by curve 732. Based on the photoswitchable material 602 changing from the first structural state 202 (FIG. 2) to the second structural state 206 (FIG. 2), the optoelectronic device 600 exhibits the characteristics of curve 732. As depicted, curve 732 is shifted to the left relative to curve 726. Thus, based on the relative shift in the curves 726, 732, an approximately 30V change in threshold voltage ($\Delta V_{th}$) occurs for the optoelectronic device 600 as a result of the photoswitchable material 602 changing from the first structural state 202 (FIG. 2) to the second structural state 206 (FIG. 2). Referring to Equations (1) and (2), since the $V_{bi}$ is related to the device 600 threshold ($V_{th}$), changes in threshold voltage ($\Delta V_{th}$) causes changes in the $V_{bi}$, which in turn results in the depletion region $W_D$ (FIG. 6) thickness varying (e.g., $t_{d1} \leftrightarrow t_{d2}$). In FIGS. 7A and 7B, curves 706 and 726 may represent the optoelectronic device 600 in a read-mode, while curves 712 and 732 may represent the optoelectronic device 600 in a write-mode.

FIGS. 8A and 8B represent the same characteristic curves depicted in respective FIGS. 7A and 7B. However, FIGS. 8A and 8B illustrate the response of the optoelectronic device 600 of FIG. 6 during an additional erase operation. Referring to FIG. 8A, a graph 800A representing the operating principle of optoelectronic device 600 in relation to the erase operation is depicted. Once the optoelectronic device 600 is in the write-mode, as indicated by curve 812, an erase operation may cause the optoelectronic device 600 to return to the read-mode, as indicated by curve 806. The erase operation returns the photoswitchable material 602 from the second structural state 206 (FIG. 2) back to the first structural state 202 (FIG. 2) by exposing the photoswitchable material 602 to a wavelength in the infrared-visible range. For example, the photoswitchable material 602 may be exposed to the emissions of a green laser. Thus, the optoelectronic device 600 exhibiting the characteristics of curve 812 should return to operating under the characteristics of curve 806. However, in some instances, this does not occur and curve 812 shifts to curve 810 rather than back to curve 806. One phenomenon that may cause this is when heat (e.g., 125 degrees Celsius) is used to generate infrared radiation for returning the photoswitchable material 602 from the second structural state 206 (FIG. 2) back to the first structural state 202 (FIG. 2). After heating, the photoswitchable material 602 may agglomerate in small clusters on silicon islands. In order to mitigate such an occurrence, for example, a green light source may be used to illuminate the photoswitchable material 602 during erase the operation. Moreover, photoswitchable materials having higher temperature stability may also be considered.

Referring to FIG. 8B, another graph 800B representing the operating principle of the optoelectronic device 600 in relation to the erase operation is depicted. Once the optoelectronic device 600 is in the write-mode, as indicated by curve 832, an erase operation may cause the optoelectronic device 600 to return to the read-mode, as indicated by curve 826. The erase operation returns the photoswitchable material 602 from the second structural state 206 (FIG. 2) back to the first structural state 202 (FIG. 2) by exposing the photoswitchable material 602 to a wavelength in the infrared-visible range. For example, the photoswitchable material 602 may be exposed to the emissions of a green laser. Thus, the optoelectronic device 600 exhibiting the characteristics of curve 832 should return to operating under the characteristics of curve 826. However, in some instances, this does not occur and curve 832 shifts to curve 830 rather than back to curve 826. One phenomenon that may cause this is when heat (e.g., 125 degrees Celsius) is used to generate infrared radiation for returning the photoswitchable material 602 from the second structural state 206 (FIG. 2) back to the first structural state 202 (FIG. 2). As previously described, after heating, the photoswitchable material 602 may agglomerate in small clusters on silicon islands.

Figure 9:
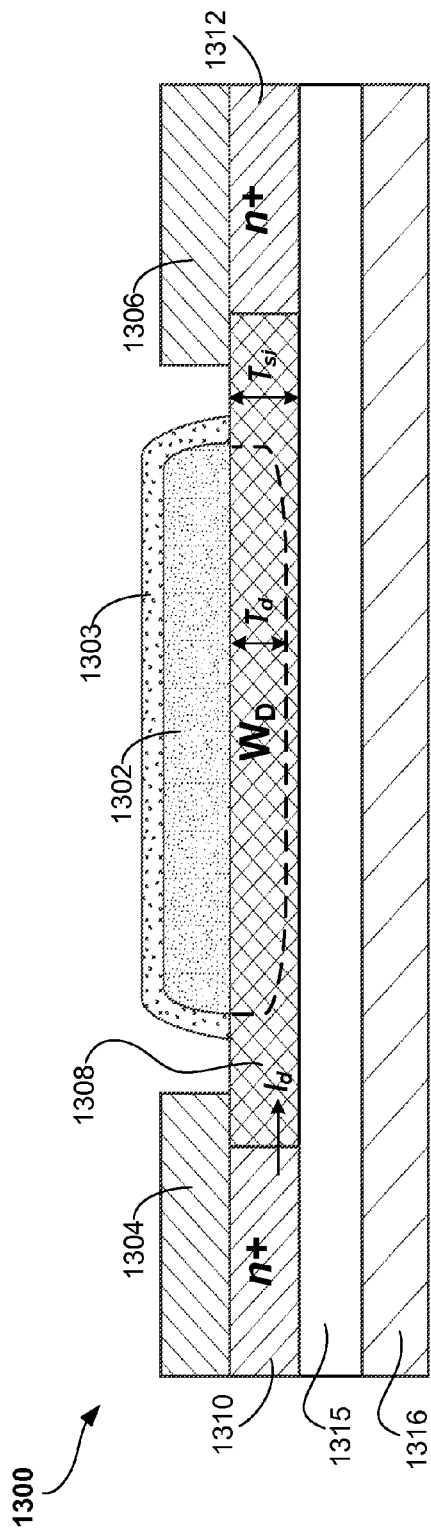
FIG. 9 illustrates a JFET device structure using a photoswitchable material as a gate according to one embodiment.

Referring to FIG. 9, another optoelectronic device 1300 according to one embodiment is depicted. The optoelectronic device 1300 may include a photoswitchable material 1302, an optional antireflection coating layer 1303 located over the photoswitchable material 1302, electrical contact 1304, electrical contact 1306, an N-type semiconductor channel region 1308, a source region 1310, a drain region 1312, an insulating substrate such as a buried oxide layer (BOX) 1315, and a metal back-gate structure 1316.

Optoelectronic device 1300 may incorporate photoswitchable material 1302 as the gate of a JFET structure. The operation and structure of optoelectronic device 1300 is similar to that of optoelectronic 600 (FIG. 6). Moreover, as with optoelectronic 600 (FIG. 6), a passivation layer 620 (FIG. 6) may be formed (not shown) at the interface between the photoswitchable material 1302 and the N-type semiconductor channel region 1308 in order to prevent Fermi level pinning. Also, as with optoelectronic 600 (FIG. 6), photoswitchable material 1302 may include the 1',3'-Dihydro-8-methoxy-1', 3',3'-trimethyl-6-nitrospiro [2H-1-benzopyran-2,2'-(2H)-indole] molecule 200 depicted in FIG. 2.

As illustrated, the metal back-gate structure 1316 (optionally included) is formed on the underside of the BOX layer 1315, while the N-type semiconductor channel region 1308 is formed on the top surface of the BOX layer 1315. The source region 1310 and the drain region 1312 are in contact with the semiconductor channel region 1308. In particular, the source region 1310 and the drain region 1312 may be formed within the N-type semiconductor channel region 1308.

The N-type semiconductor channel region 1308 may include a silicon substrate having a thickness $T_{si}$ in the range of about 5-500 nm The N-type semiconductor channel region 1308 may, for example, be formed from silicon and doped with donors (e.g., Phosphorous) to a doping concentration in the range of about $5\times10^{14}$ cm$^{-3}$ to $5\times10^{18}$ cm$^{-3}$. The source region 1310 and the drain region 1312 may be formed by negatively doping (i.e., by ion implantation) designated areas of the N-type semiconductor channel region 1308 to form the n+ regions in a manner similar to, or identical to that used to form source/drain regions of Field Effect Transistor (i.e., n-channel device) structures. For example, N-type donors such as Phosphorous (P) may be used to create the n+ regions 1310, 1312. As previously described, depending on the structural or molecular state of the 1',3'-Dihydro-8-methoxy-1',3', 3'-trimethyl-6-nitrospiro [2H-1-benzopyran-2,2'-(2H)-indole] molecule 200 (FIG. 2) used to implement photoswitchable material 1302, the depletion region $W_D$ thickness $T_d$ and resulting source/current flow $I_d$ between source region 1310 and drain region 1312 varies.

Figure 10:
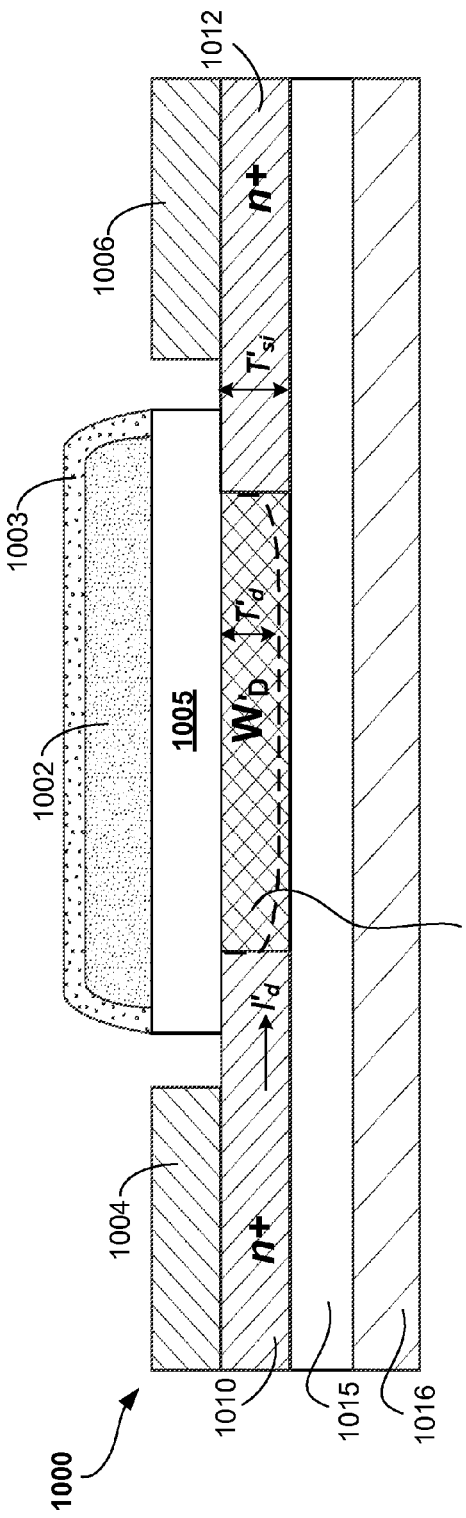
FIG. 10 illustrates a MOSFET device structure using a photoswitchable material as a gate according to one embodiment.

Referring to FIG. 10, another optoelectronic device 1000 according to one embodiment is depicted. The optoelectronic device 1000 may include a photoswitchable material 1002, an optional antireflection coating layer 1003 located over the photoswitchable material 1002, electrical contact 1004, electrical contact 1006, an N-type semiconductor channel region 1008, a source region 1010, a drain region 1012, a dielectric layer 1005 located between the N-type semiconductor channel region 1008 and the photoswitchable material 1002, an insulating substrate such as a buried oxide layer (BOX) 1015, and a metal back-gate structure 1016.

Optoelectronic device 1000 may incorporate photoswitchable material 1002 and underlying dielectric layer 1005 as the gate of a MOSFET structure. The operation and structure of optoelectronic device 1000 is also similar to that of optoelectronic 600 (FIG. 6). Moreover, as with optoelectronic 600 (FIG. 6), photoswitchable material 1002 may include the 1',3'-Dihydro-8-methoxy-1',3',3'-trimethyl-6-nitrospiro [2H-1-benzopyran-2,2'-(2H)-indole] molecule 200 depicted in FIG. 2.

As depicted, the metal back-gate structure 1016 (optionally included) is formed on the underside of the BOX layer 1015, while the N-type semiconductor channel region 1008 is formed on the top surface of the BOX layer 1015. The source region 1010 and the drain region 1012 are in contact with the semiconductor channel region 1008. In particular, the source region 1010 and the drain region 1012 may be formed within the N-type semiconductor channel region 1008.

The N-type semiconductor channel region 1008 may include a silicon substrate having a thickness $T'_{si}$ in the range of about 5-500 nm The N-type semiconductor channel region 1008 may, for example, be formed from silicon and doped with donors (e.g., Phosphorous) to a doping concentration in the range of about $5 \times 10^{14}$ cm$^{-3}$ to $5 \times 10^{18}$ cm$^{-3}$. The source region 1010 and the drain region 1012 may be formed by negatively doping (i.e., by ion implantation) designated areas of the N-type semiconductor channel region 1008 to form the n+ regions in a manner similar to, or identical to that used to form source/drain regions of Field Effect Transistor (i.e., n-channel device) structures. For example, N-type donors such as Phosphorous (P) may be used to create the n+ regions 1010, 1012. As previously described, depending on the structural or molecular state of the 1',3'-Dihydro-8-methoxy-1',3', 3'-trimethyl-6-nitrospiro [2H-1-benzopyran-2,2'-(2H)-indole] molecule 200 (FIG. 2) used to implement photoswitchable material 1002, the depletion region $W'_D$ thickness $T'_d$ and resulting source/current flow $I'_d$ between source region 1010 and drain region 1012 accordingly varies. FIGS. 9 and 10 are illustrative of different device embodiments (e.g., JFET, MOSFET) that may utilize a photoswitchable material structure to control current flow in an underlying channel structure, whereby energy level band bending at the interface region between these two structures enables the generation of an optically controllable electrical current.

Figure 11:
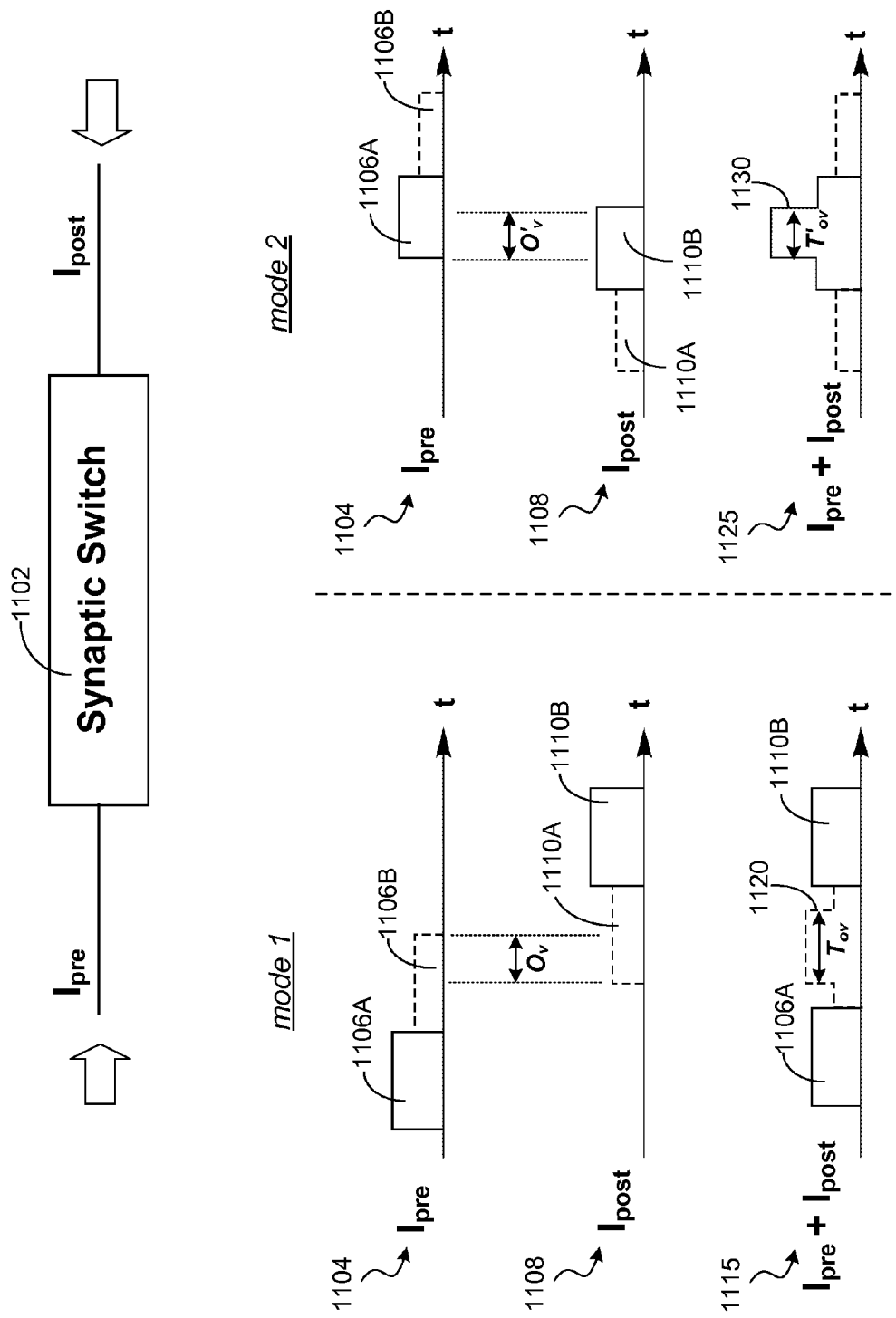
FIG. 11, illustrates the operation of an optoelectronic device as a synaptic switch according to one embodiment.

FIG. 11, illustrates the operation of an optoelectronic device as a synaptic switch 1102 according to one embodiment. Synaptic switch 1102 may, for example, include an optoelectronic device such as optoelectronic device 600 of FIG. 6. The operation of the synaptic switch 1102 depends on the order in which the switch 1102 receives a pre-synaptic signal ($I_{pre}$) and a post synaptic signal ($I_{post}$). For example, as depicted, in operating mode 1, the pre-synaptic signal ($I_{pre}$) arrives prior to the post synaptic signal ($I_{post}$). Alternatively, in operating mode 2, the pre-synaptic signal ($I_{pre}$) arrives after to the post synaptic signal ($I_{post}$). In both modes 1 & 2, however, there is a temporal (i.e., time-based) overlap ($O_v$) between the synaptic signal ($I_{pre}$) and the post synaptic signal ($I_{post}$). The pre-synaptic signal ($I_{pre}$) includes an optical signal 1104 having optical pulse 1106A and optical pulse 1106B, whereby optical pulse 1106A has a first optical wavelength (e.g., green wavelength) and second optical pulse 1106B has a second optical wavelength (e.g., UV wavelength). Similarly, the post-synaptic signal ($I_{post}$) includes an optical signal 1108 having optical pulse 1110A and optical pulse 1110B, whereby optical pulse 1110A has the second optical wavelength (e.g., UV wavelength) and optical pulse 1110B has the first optical wavelength (e.g., green wavelength). The exemplary modes of operation of synaptic switch 1102 will be described with the aid of optoelectronic device 600 (FIG. 6).

In mode 1, the pre-synaptic signal ($I_{pre}$) including optical signal 1104 arrives prior to the post-synaptic signal ($I_{post}$) including optical signal 1108 at optoelectronic device 600 (FIG. 6). More particularly, optical signal 1104 is incident on the photoswitchable material 602 (FIG. 6) prior to when optical signal 1108 is incident on the photoswitchable material 602. However, as depicted, optical signal 1104 and optical signal 1108 overlap by $O_v$. Rather, optical pulse 1106B from optical signal 1104 ($I_{pre}$) and optical pulse 1110A from optical signal 1108 ($I_{post}$) overlap in part for a duration. As previously indicated, optical pulse 1106B and optical pulse 1110A may include a UV wavelength.

Optical signal 1115 depicts both optical signal 1104 ($I_{pre}$) and optical signal 1108 ($I_{post}$), which are both incident on the photoswitchable material 602 of optoelectronic device 600. Due to the temporal overlap between optical pulse 1106B and optical pulse 1110A, constructive optical interference results and an increased optical intensity 1120 occurs for the duration $T_{ov}$ of the overlap $O_v$. The intensity of each of the individual pulses 1106B, 1110A is designated to be less than the threshold value required to switch the photoswitchable material 602 towards the second structural state 206 (FIG. 2) based on an incident UV wavelength optical signal. However, the increased optical intensity 1120 occurring for duration $T_{ov}$ is predetermined to exceed the threshold value required to switch the photoswitchable material 602 towards the second structural state 206 (FIG. 2). Thus, during this signaling scheme where the pre-synaptic signal ($I_{pre}$) including optical signal 1104 arrives prior to the post-synaptic signal ($I_{post}$) including optical signal 1108, the photoswitchable material 602 changes to the second structural state 206 (FIG. 2).

In mode 2, the pre-synaptic signal ($I_{pre}$) including optical signal 1104 arrives after the post-synaptic signal ($I_{post}$) including optical signal 1108 at photonic device 600 (FIG. 6). More particularly, optical signal 1104 is incident on the photoswitchable material 602 (FIG. 6) following when optical signal 1108 is incident on the photoswitchable material 602. However, as depicted, optical signal 1104 and optical signal 1108 overlap by $O_v$. Rather, optical pulse 1106A from optical signal 1104 and optical pulse 1110B from optical signal 1108 overlap in part for a duration. As previously indicated, optical pulse 1106A and optical pulse 1110B may include a green wavelength.

Optical signal 1125 depicts both optical signal 1104 ($I_{pre}$) and optical signal 1108 ($I_{post}$), which are both incident on the photoswitchable material 602 of optoelectronic device 600. Due to the temporal overlap between optical pulse 1106A and optical pulse 1110B, constructive optical interference results and an increased optical intensity 1120 occurs for the duration $T'_{ov}$ of the overlap $O'_v$. The intensity of each of the individual pulses 1106A, 1110B is designated to be less than the threshold value required to switch the photoswitchable material 602 towards the first structural state 202 (FIG. 2) based on an incident green wavelength optical signal. However, the increased optical intensity 1130 occurring for duration $T'_{ov}$ is predetermined to exceed the threshold value required to switch the photoswitchable material 602 towards the first structural state 202 (FIG. 2). Thus, during this signaling scheme where the pre-synaptic signal ($I_{pre}$) including optical signal 1104 arrives after to the post-synaptic signal ($I_{post}$) including optical signal 1108, the photoswitchable material 602 changes to the first structural state 202 (FIG. 2).

Figure 12:
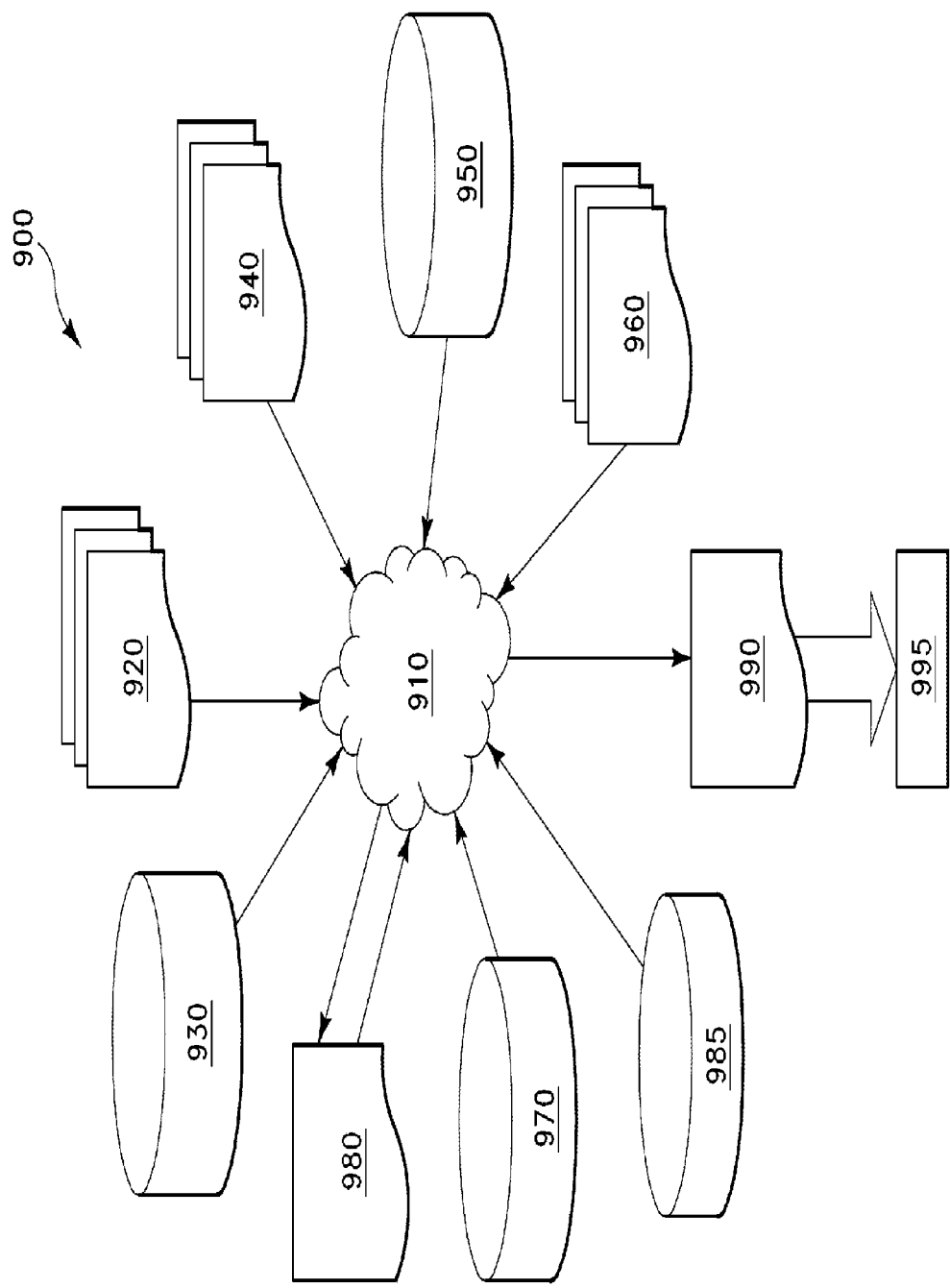
FIG. 12 is a flow diagram of a design process used in semiconductor design, manufacture, and/or test.

FIG. 12 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1, 6, 9, and 10. The design structure processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems.

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 920 that is preferably processed by a design process 910. In one embodiment, the design structure 920 includes design data used in a design process and including information describing embodiments of the invention with respect to the structures as shown in FIGS. 1, 6, 9, and 10. The design data in the form of schematics or HDL, a hardware-description language (e.g., Verilog, VHDL, C, etc.) may be embodied on one or more machine readable media. For example, design structure 920 may be a text file, numerical data or a graphical representation of the embodiments of the invention, as shown in FIGS. 1, 6, 9, and 10. Design structure 920 may be a logical simulation design structure generated and processed by design process 910 to produce a logically equivalent functional representation of a hardware device. Design structure 920 may also or alternatively include data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as that shown in FIGS. 1, 6, 9, and 10. As such, design structure 920 may include files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1, 6, 9, and 10 to generate a netlist 980 which may contain a design structure such as design structure 920. Netlist 980 may include, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 including second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably includes one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 6, 9, and 10. In one or more embodiments, design structure 990 may include a compiled, executable HDL simulation model that functionally simulates the devices shown in FIGS. 1, 6, 9, and 10.

Design structure 990 may also employ a data format used for the exchange of layout data of integrated circuits and/or symbolic data format (e.g. information stored in a GDSII (GDS2), GL1, OASIS, map files, or any other suitable format for storing such design data structures).

Design structure 990 may include information such as, for example, symbolic data, map files, test data files, design content files, manufacturing data, layout parameters, wires, levels of metal, vias, shapes, data for routing through the manufacturing line, and any other data required by a manufacturer or other designer/developer to produce devices or structures as described above and shown in FIGS. 1, 6, 9, and 10. Design structure 990 may then proceed to a stage 995 where, for example, design structure 990: proceeds to tapeout, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more described embodiment, the practical application or technical improvement over technologies found in the marketplace, or to enable other of ordinary skill in the art to understand the one or more embodiments disclosed herein.

What is claimed is:

1. An optoelectronic device comprising:
   an insulating substrate;
   a semiconductor channel region located on the insulating substrate;
   a source region and a drain region in contact with the semiconductor channel region; and
   a photoswitchable material located on the semiconductor channel region between the source region and the drain region, the photoswitchable material including a first structural state based on being exposed to a first optical wavelength, and including a second structural state based on being exposed to a second optical wavelength,
   wherein the first structural state causes a first electrical current to flow between the source region and the drain region, and the second structural state causes a second electrical current to flow between the source region and the drain region.

2. The device of claim 1, further comprising:
   a passivation layer located directly over the semiconductor channel region and located directly under the photoswitchable material, the passivation layer preventing Fermi level pinning associated with an interface between the semiconductor channel region and the photoswitchable material.

3. The device of claim 2, wherein the passivation layer comprises an organic monolayer.

4. The device of claim 1, further comprising:
   a back gate structure underlying the insulating substrate, wherein the back gate structure controls the first electrical current and the second electrical current that flow between the source region and the drain region.

5. The device of claim 1, wherein the photoswitchable material comprises a 1',3'-Dihydro-8-methoxy-1',3',3'-trimethyl-6-nitrospiro [2H-1-benzopyran-2,2'-(2H)-indole] molecule.

6. The device of claim 5, wherein the first optical wavelength comprises an ultraviolet (UV) wavelength and the second optical wavelength comprises a range of infrared (IR)-visible wavelengths.

7. The device of claim 1, wherein the insulating substrate comprises a buried oxide (BOX) layer.

8. The device of claim 1, wherein the semiconductor channel region comprises silicon having a doping concentration in the range of about $5\times10^{14}$ cm$^{-3}$ to $5\times10^{18}$ cm$^{-3}$ and a thickness in the range of about 5-500 nm.

9. A method of forming an optoelectronic device comprising:
   providing an insulating substrate;
   forming a semiconductor layer above the insulating substrate, the semiconductor layer creating a semiconductor channel region having a thickness;
   forming a source region and a drain region in contact with the semiconductor channel region; and
   forming a photoswitchable material on the semiconductor channel region between the source region and the drain region, the photoswitchable material switching to a first structural state based on being exposed to a first optical wavelength, and switching to a second structural state based on being exposed to a second optical wavelength,
   wherein the first structural state generates a first depletion region within the semiconductor channel region, and the second structural state generates a second depletion region within the semiconductor channel region.

10. The method of claim 9, wherein the first depletion region includes a first depletion region thickness that includes at least the same thickness as the thickness of the semiconductor channel region, the first depletion region thickness inhibiting current flow between the source region and the drain region.

11. The method of claim 9, wherein the second depletion region includes a second depletion region thickness that is less than the thickness of the semiconductor channel region, the second depletion region thickness enabling current flow between the source region and the drain region.

12. The method of claim 9, wherein the photoswitchable material comprises a 1',3'-Dihydro-8-methoxy-1',3',3'-trimethyl-6-nitrospiro [2H-1-benzopyran-2,2'-(2H)-indole] molecule.

13. The method of claim 9, wherein the first structural state causes a first electrical current to flow between the source region and the drain region, and the second structural state causes a second electrical current to flow between the source region and the drain region.

14. The method of claim 9, further comprising:
   forming a passivation layer directly over the semiconductor channel region; and
   forming the photoswitchable material directly over the passivation layer,
   wherein the passivation layer prevents Fermi level pinning associated with an interface between the semiconductor channel region and the photoswitchable material.

15. The method of claim 14, wherein the passivation layer comprises an organic monolayer.

16. A method of generating a synaptic switch, comprising:
   forming a semiconductor channel region above an insulating layer;

forming a photoswitchable material on the semiconductor channel region, wherein the photoswitchable material switches towards a first structural state based on being exposed to a first optical wavelength, and switches towards a second structural state based on being exposed to a second optical wavelength;

exposing the photoswitchable material with a first optical signal that includes a first optical pulse having the first optical wavelength followed by a second optical pulse having the second optical wavelength; and exposing the photoswitchable material with a second optical signal that includes a third optical pulse having the second optical wavelength followed by a fourth optical pulse having the first optical wavelength, wherein the photoswitchable material switches in-between the first structural state and the second structural state based on a timing order between the first and the second optical signal.

17. The method of claim 16, wherein the first optical signal comprises a pre-synaptic signal and, wherein the second optical signal comprises a post-synaptic signal.

18. The method of claim 17, wherein the timing order comprises the photoswitchable material switching towards the first structural state based on the pre-synaptic signal arriving before the post-synaptic signal and overlapping with the post-synaptic signal.

19. The method of claim 18, wherein the timing order comprises the photoswitchable material switching towards the second structural state based on the pre-synaptic signal arriving after the post-synaptic signal and overlapping with the post-synaptic signal.

20. The method of claim 19, wherein, based on the pre-synaptic signal arriving before the post-synaptic signal and overlapping with the post-synaptic signal, the second and the third optical pulse overlap causing the second optical wavelength to switch the photoswitchable material towards the first structural state, and wherein, based on the pre-synaptic signal arriving after the post-synaptic signal and overlapping with the post-synaptic signal, the first and the fourth optical pulse overlap causing the first optical wavelength to switch the photoswitchable material towards the second structural state.

\* \* \* \* \*